(12) United States Patent
Iura et al.

(10) Patent No.: US 9,306,728 B2
(45) Date of Patent: Apr. 5, 2016

(54) SIGNAL GENERATING DEVICE

(71) Applicant: Mitsubishi Electric Corporation, Chiyoda-ku (JP)

(72) Inventors: Hiroki Iura, Tokyo (JP); Koji Tomitsuka, Tokyo (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 14/418,254

(22) PCT Filed: Jul. 31, 2013

(86) PCT No.: PCT/JP2013/070737
§ 371 (c)(1),
(2) Date: Jan. 29, 2015

(87) PCT Pub. No.: WO2014/027570
PCT Pub. Date: Feb. 20, 2014

(65) Prior Publication Data
US 2015/0188692 A1    Jul. 2, 2015

(30) Foreign Application Priority Data

Aug. 13, 2012 (JP) ................................. 2012-179361

(51) Int. Cl.
*H04L 7/00* (2006.01)
*H03H 17/02* (2006.01)
(Continued)

(52) U.S. Cl.
CPC ......... *H04L 7/0025* (2013.01); *H03H 17/0227* (2013.01); *H03H 17/0286* (2013.01);
(Continued)

(58) Field of Classification Search
CPC .......... H03H 17/0227; H03H 17/0286; H03H 17/0294; H03H 17/00; H03H 17/0621; H03H 2017/0222; H04L 7/08; H04L 7/0025
See application file for complete search history.

(56) References Cited

U.S. PATENT DOCUMENTS 5,506,798 A    4/1996   Shimada et al.
5,764,113 A    6/1998   Snell
(Continued)

FOREIGN PATENT DOCUMENTS

JP    05-327409 A    12/1993
JP    07-202633 A    8/1995
(Continued)

OTHER PUBLICATIONS

International Search Report issued Nov. 5, 2013 in PCT/JP2013/070737 Filed Jul. 31, 2013.
(Continued)

*Primary Examiner* — Syed Haider
(74) *Attorney, Agent, or Firm* — Oblon, McClelland, Maier & Neustadt, L.L.P.

(57) ABSTRACT

A signal generating device includes a first digital filter unit outputting a first interpolated signal by interpolating an input signal, a second digital filter unit outputting a second interpolated signal by interpolating the first interpolated signal, a phase calculation unit calculating a phase of a digital signal, a phase-accuracy conversion unit calculating first phase signal and second phase signal, a first memory storing filter coefficients, a first coefficient readout unit reading filter coefficients from the first memory and switching filter coefficients of the first digital filter unit, a phase-error calculation unit calculating a phase error signal, a second memory storing filter coefficients, a second coefficient readout unit reading filter coefficients from the second memory, and a gain normalization unit normalizing a gain of the filter coefficients to maintain a constant sum of the filter coefficients and switching filter coefficients of the second digital filter unit.

5 Claims, 4 Drawing Sheets

(51) Int. Cl.
*H03H 17/06* (2006.01)
*H04L 7/08* (2006.01)

(52) U.S. Cl.
CPC ....... *H03H17/0294* (2013.01); *H03H 17/0621* (2013.01); *H04L 7/08* (2013.01); *H03H 2017/0222* (2013.01)

(56) References Cited

U.S. PATENT DOCUMENTS

| | | | | |
|---|---|---|---|---|
| 6,014,682 | A * | 1/2000 | Stephen | H03H 17/0275 708/276 |
| 6,487,573 | B1 | 11/2002 | Jiang et al. | |
| 7,308,240 | B2 | 12/2007 | Kishi | |
| 7,505,537 | B1 * | 3/2009 | Sutardja | H03G 3/3036 341/139 |
| 2001/0005175 | A1 * | 6/2001 | Honma | 341/155 |
| 2002/0116427 | A1 | 8/2002 | Jiang et al. | |
| 2003/0172098 | A1 | 9/2003 | Jiang et al. | |
| 2008/0080650 | A1 * | 4/2008 | Adachi | 375/355 |
| 2009/0261994 | A1 * | 10/2009 | Petrov | 341/61 |
| 2010/0189197 | A1 * | 7/2010 | Nakatani | H04B 1/28 375/340 |
| 2012/0066561 | A1 * | 3/2012 | Feller | 714/746 |
| 2012/0296608 | A1 * | 11/2012 | Tomitsuka et al. | 702/190 |

FOREIGN PATENT DOCUMENTS

| | | |
|---|---|---|
| JP | 10-285124 A | 10/1998 |
| JP | 2000-312187 A | 11/2000 |
| JP | 2004-193996 A | 7/2004 |
| JP | 2004-274624 A | 9/2004 |
| WO | WO 2011/090110 A1 | 7/2011 |

OTHER PUBLICATIONS

Yoshikazu Nishimura, "Communication system design by digital signal processing", CQ Publishing Co., Ltd., 2006, pp. 79-93 and Cover Pages.

* cited by examiner

FIG.4

| 0TH FILTER COEFFICIENT (FOR 0/Q PHASE) | $w(0,0)$ | $w(0,1)$ | $\cdots$ | $w(0,L-1)$ |
|---|---|---|---|---|
| 1ST FILTER COEFFICIENT (FOR 1/Q PHASE) | $w(1,0)$ | $w(1,1)$ | $\cdots$ | $w(1,L-1)$ |
| $\vdots$ | $\vdots$ | $\vdots$ | | $\vdots$ |
| Q-1TH FILTER COEFFICIENT (FOR Q-1/Q PHASE) | $w(Q-1,0)$ | $w(Q-1,1)$ | $\cdots$ | $w(Q-1,L-1)$ |

| | | | | |
|---|---|---|---|---|
| $B(m-1)$ | $(3,m-1)$ | $(2,m-1)$ | $(1,m-1)$ | $(0,m-1)$ |
| $B(m-2)$ | $(3,m-2)$ | $(2,m-2)$ | $(1,m-2)$ | $(0,m-2)$ |
| $\vdots$ | $\vdots$ | $\vdots$ | $\vdots$ | $\vdots$ |
| $B(m-K)$ | $(3,m-K)$ | $(2,m-K)$ | $(1,m-K)$ | $(0,m-K)$ |

FIG.6

| | | | | |
|---|---|---|---|---|
| 0TH FILTER COEFFICIENT<br>(FOR 0/(P×N) PHASE) | u(0,0) | u(0,1) | ⋯ | u(0,K-1) |
| 1ST FILTER COEFFICIENT<br>(FOR N/(P×N) PHASE) | u(1,0) | u(1,1) | ⋯ | u(1,K-1) |
| ⋮ | ⋮ | ⋮ | | ⋮ |
| P-1TH FILTER COEFFICIENT<br>(FOR (P×N-N)/(P×N) PHASE) | u(P-1,0) | u(P-1,1) | ⋯ | u(P-1,K-1) |

SIGNAL GENERATING DEVICE

FIELD

The present invention relates to a signal generating device that interpolates a digital signal.

BACKGROUND

Conventionally, to adjust the phase of a digital signal, it is required to perform signal interpolation (oversampling) to take out a signal of a required phase. For example, Non Patent Literature 1 mentioned below discloses a technique in which a signal of a desired phase is generated by using a digital filter and a filter coefficient corresponding to each phase interval to be adjusted, thereby interpolating the digital signal.

Furthermore, Patent Literature 1 mentioned below discloses, as a specific configuration thereof, a technique related to a variable digital filter that can change frequency characteristics without disturbing characteristics of the digital filter. Coefficient that can interpolate different phases by changing a multiplier factor of a multiplier are stored in a memory address, coefficient data that interpolates a phase closest to a desired phase value is read out, and the multiplier factor of the multiplier is changed, thereby obtaining an interpolated value close to a true value. Consequently, the memory capacity is reduced, while enabling the frequency characteristics to be finely adjusted without disturbing the filter characteristics.

CITATION LIST

Patent Literature

Patent Literature 1: International Publication No. WO2011/090110

Non Patent Literature

Non Patent Literature 1: Yoshikazu Nishimura "Communication System Design by Digital Signal Processing", CQ Publishing CO., Ltd., 2006

SUMMARY

Technical Problem

However, according to the conventional techniques mentioned above, the coefficients that can interpolate the phase are stored in the memory address. Therefore, there is a problem in that when an interpolated value closer to a true value is attempted to be acquired, more coefficients need to be stored in the memory address, thereby increasing the memory capacity.

The present invention has been achieved in view of the above problems, and an object of the present invention is to provide a signal generating device that can generate an interpolated signal without increasing the memory capacity when an interpolated value close to a true value is acquired.

Solution to Problem

In order to solve the above problems and achieve the object, the present invention relates to a signal generating device including: a first digital filter that outputs a first interpolated signal by interpolating an input signal; a second digital filter that outputs a second interpolated signal by interpolating the first interpolated signal to correct a phase error; a phase calculation unit that calculates a phase of a digital signal that changes by a time step updated for each output sampling cycle of two digital filters; a phase-accuracy conversion unit that calculates a first phase signal being an address that indicates a filter coefficient to be used for interpolation by the first digital filter, and a second phase signal for calculating an address that indicates a filter coefficient to be used for interpolation by the second digital filter, on a basis of the phase of the digital signal; a first memory that stores therein a filter coefficient at an address indicated by the first phase signal; a first coefficient readout unit that reads out a filter coefficient from the first memory on a basis of the first phase signal and switches a filter coefficient of a multiplier included in the first digital filter; a phase-error calculation unit that calculates a phase error signal being an address that indicates a filter coefficient to be used for interpolation by the second digital filter on a basis of the second phase signal; a second memory that stores therein a filter coefficient at an address indicated by the phase error signal; a second coefficient readout unit that reads out a filter coefficient from the second memory on a basis of the phase error signal; and a gain normalization unit that normalizes a gain of the filter coefficient to maintain a constant sum of filter coefficients read out from the second memory in the second coefficient readout unit and switches a filter coefficient of a multiplier included in the second digital filter.

Advantageous Effects of Invention

The signal generating device according to the present invention obtains an effect where it is possible to generate an interpolated signal without increasing the memory capacity when an interpolated value close to a true value is acquired.

BRIEF DESCRIPTION OF DRAWINGS

FIG. 4 is a diagram showing the internal configuration of a memory 5.

FIG. 5 is a diagram showing a shift register provided in a phase-error calculation unit 7.

FIG. 6 is a diagram showing the internal configuration of a memory 8.

DESCRIPTION OF EMBODIMENTS

Exemplary embodiments of a signal generating device according to the present invention will be explained below in detail with reference to the accompanying drawings. The present invention is not limited to the embodiments.

Embodiment.

Figure 1:
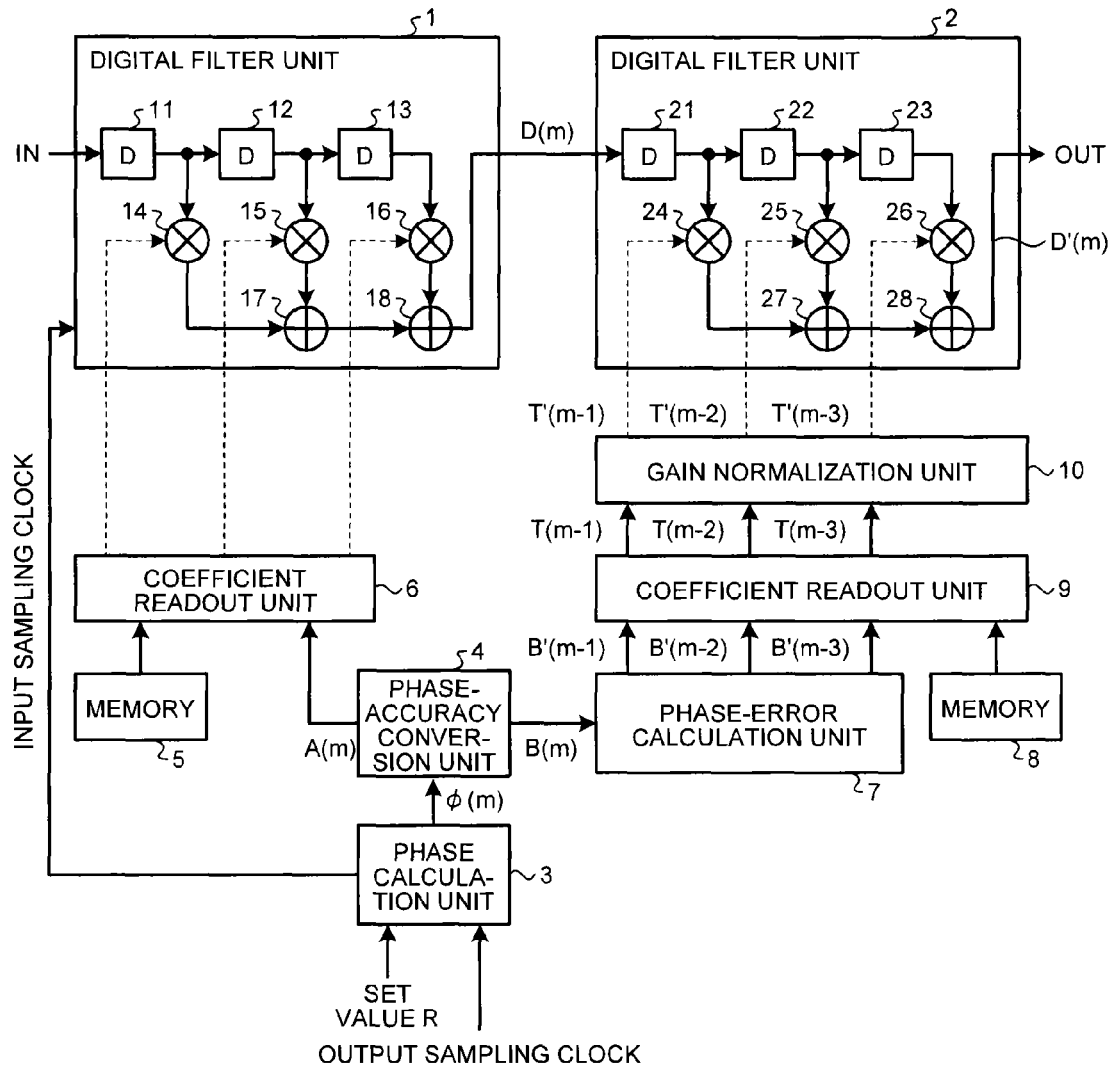
FIG. 1 is a diagram showing a configuration example of a signal generating device.

FIG. 1 is a diagram showing a configuration example of a signal generating device according to the present embodiment. The signal generating device includes a digital filter unit 1, a digital filter unit 2, a phase calculation unit 3, a phase-accuracy conversion unit 4, a memory 5, a coefficient readout unit 6, a phase-error calculation unit 7, a memory 8, a coefficient readout unit 9, and a gain normalization unit 10.

The digital filter unit 1 is a first digital filter that performs a product-sum operation of an input signal and filter coefficients stored in the memory 5 to generate an interpolated signal D(m). The digital filter unit 1 includes delay units 11, 12, and 13, multipliers 14, 15, and 16, and adders 17 and 18. Because the digital filter unit 1 has a generally used configuration, detailed explanations thereof will be omitted.

The digital filter unit 2 is a second digital filter that performs a product-sum operation of an output of the digital filter unit 1 (the interpolated signal D(m)) and filter coefficients stored in the memory 8 to generate an interpolated signal D'(m). The digital filter unit 2 includes delay units 21, 22, and 23, multipliers 24, 25, and 26, and adders 27 and 28. Because the digital filter unit 2 has a generally used configuration as in the digital filter unit 1, detailed explanations thereof will be omitted.

The phase calculation unit 3 calculates a phase ($\phi(m)$) of a digital signal to be used by a relevant device on the basis of a given set value, a phase resolution of the relevant device, and the like.

The phase-accuracy conversion unit 4 calculates a phase signal (A(m)), which is an address for selecting the filter coefficients to be used by the digital filter unit 1, and a phase signal (B(m)) for calculating phase error signals, which are addresses for selecting filter coefficients to be used by the digital filter unit 2, on the basis of the phase of the digital signal calculated by the phase calculation unit 3.

The memory 5 is a first memory (storage unit) for storing therein the filter coefficients to be used by the digital filter unit 1.

The coefficient readout unit 6 is a first coefficient readout unit that reads out filter coefficients from the memory 5 to switch the filter coefficients to be used by the digital filter unit 1.

The phase-error calculation unit 7 calculates the phase error signals (B'(m−1), B'(m−2), and B'(m−3)), which are addresses for selecting filter coefficients to be used by the digital filter unit 2, by using a past value of the phase signal (B(m)) from the phase-accuracy conversion unit 4 and the number of oversamplings.

The memory 8 is a second memory (storage unit) for storing therein the filter coefficients to be used by the digital filter unit 2.

The coefficient readout unit 9 is a second coefficient readout unit that reads out the filter coefficients from the memory 8 to output the filter coefficients to the gain normalization unit 10.

The gain normalization unit 10 normalizes the filter coefficients to switch the filter coefficients to be used by the digital filter unit 2.

Subsequently, an operation of generating an interpolated signal by the signal generating device is explained. An operation of the phase calculation unit 3 is explained first. First, a value R obtained by the following equation (1) is provided to the phase calculation unit 3 as a set value. In this example, M denotes a phase resolution of the signal generating device and is set to an integer value equal to or larger than 0. It is assumed here that if a right-hand side is indivisible, the first decimal place is rounded off to obtain an integer value. A setting method of the phase resolution M is described later.

$$R = M \times (\text{input sampling frequency})/(\text{output sampling frequency}) \quad (1)$$

Next, the phase calculation unit 3 cumulatively adds the set value R for each output sampling frequency as shown in the following equation (2) to calculate a phase of the digital signal. It is assumed here that the phase of the digital signal being a cumulative addition result is $\phi(m)$, where m denotes a time step to be updated for each output sampling cycle and mod denotes a remainder operation. The phase calculation unit 3 outputs the calculated phase $\phi(m)$ of the digital signal to the phase-accuracy conversion unit 4.

$$\phi(m) = (\phi(m-1) + R) \bmod M \quad (2)$$

The phase calculation unit 3 also generates a pulse at a timing at which the phase $\phi(m)$ of the digital signal exceeds the phase resolution M and returns to 0, to generate a clock of the input sampling frequency. The generated clock is used for an input timing of the input signal of the digital filter unit 1 as an input sampling clock.

Figure 2:
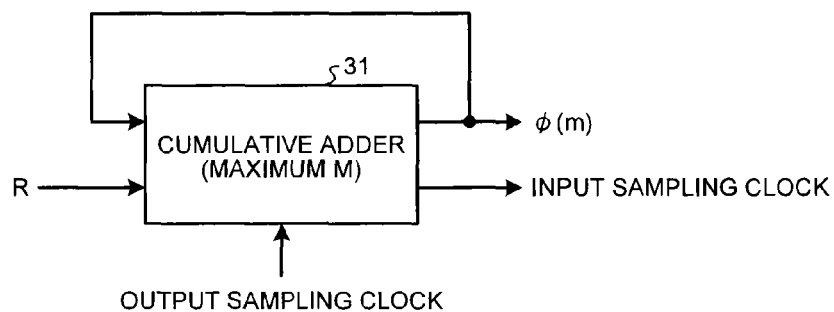
FIG. 2 is a diagram showing a configuration example of a phase calculation unit 3.

FIG. 2 is a diagram showing a configuration example of the phase calculation unit 3. The phase calculation unit 3 includes a cumulative adder 31. In FIG. 2, the set value R is a value calculated by the above equation (1), and an interpolated (oversampling) signal of an arbitrary magnification can be generated by changing the set value R. The output sampling clock is a clock of the output sampling cycle. The phase $\phi(m)$ of the digital signal is a value calculated by the above equation (2) and indicates the phase of the digital signal for each output sampling cycle. As is obvious from the above equation (2), the cumulative adder 31 feedbacks and inputs the output phase $\phi(m)$ of the digital signal, and uses the phase $\phi(m)$ at the time of calculating the phase of the next digital signal. The phase calculation unit 3 can calculate the phase $\phi(m)$ of the digital signal by using the cumulative adder 31 shown in FIG. 2 to cumulatively add the set value R for each output sampling clock. As described above, the phase calculation unit 3 generates and outputs the input sampling clock.

The phase-accuracy conversion unit 4 then calculates the phase signal A(m) being a first phase signal for reading out the filter coefficients to be used by the digital filter unit 1 and the phase signal B(m) being a second phase signal for calculating the phase error signals, which are addresses for selecting the filter coefficients to be used by the digital filter unit 2, on the basis of the phase $\phi(m)$ of the digital signal input from the phase calculation unit 3, according to the following equations (3) and (4), respectively. The phase-accuracy conversion unit 4 outputs the phase signal A(m) to the coefficient readout unit 6 and outputs the phase signal B(m) to the phase-error calculation unit 7.

$$A(m) = \phi(m)/P \quad (3)$$

$$B(m) = \phi(m) \bmod Q \quad (4)$$

It is assumed here that P and Q described above are integer values equal to or larger than 0 satisfying the following equation (5), and P denotes a phase resolution in the digital filter unit 2 and Q denotes a phase resolution in the digital filter unit 1. Accordingly, the phase resolution M of the signal generating device can be obtained from a product of the phase resolution P of the digital filter unit 2 and the phase resolution Q of the digital filter unit 1.

$$M = P \times Q \quad (5)$$

Figure 3:
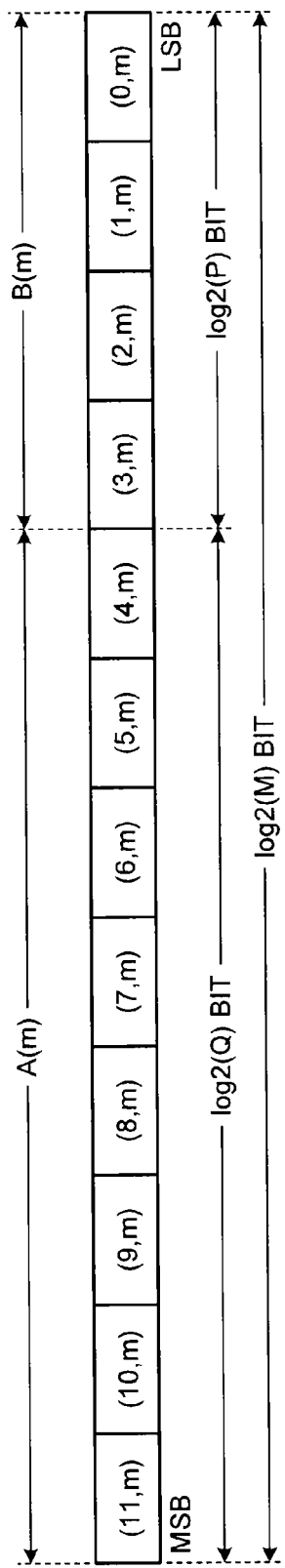
FIG. 3 is a diagram showing a specific example of operation methods of equations (3) to (5) in a phase-accuracy conversion unit 4.

FIG. 3 is a diagram showing a specific example of operation methods of the equations (3) to (5) in the phase-accuracy conversion unit 4. To simplify a circuit, as an example, an explanation will be given of a case where parameters P and Q are each represented by a power of 2 and are respectively assumed to be P=16 (4 bits) and Q=256 (8 bits), and the phase resolution M is M=4096 (12 bits) as a result of multiplication of the parameters P and Q.

The range that can be taken by the phase $\phi(m)$ of the digital signal is determined by the phase resolution M, as expressed by the equation (2). In the case of M=4096 (12 bits), the phase $\phi(m)$ of the digital signal is expressed by 12 bits. The phase signal A(m) is a value calculated by the equation (3), and in the case of P=16, the phase signal A(m) can be obtained by taking high-order 8 bits ((11, m) to (4, m)) of the phase φ(m) of the digital signal. In (x, y) in FIG. 3, x denotes a bit number and y denotes a time step number to be updated for each output sampling cycle. In the case of Q=256 (8 bits), the phase signal B(m) can be obtained by taking low-order 4 bits ((3, m) to (0, m)) of the phase φ(m) of the digital signal. The phase-accuracy conversion unit 4 outputs the phase signal A(m) to the coefficient readout unit 6 and outputs the phase signal B(m) to the phase-error calculation unit 7.

An operation on the side of the digital filter unit 1 to which the phase signal A(m) is output is explained next. The memory 5 stores therein Q sets of filter coefficients in total in order of 0/Q, 1/Q, 2/Q, . . . , (Q−1)/Q with a phase interval 1/Q of the cycle of the input sampling frequency. One set of filter coefficients is constituted of as many filter coefficients as the multipliers provided in the digital filter unit 1, and a filter coefficient corresponding to each multiplier is defined. FIG. 4 is a diagram showing the internal configuration of the memory 5. The i-th filter coefficients are filter coefficients for an i/Q phase and include w(i, 0) to w(i, L−1). L denotes the number of the multipliers provided in the digital filter unit 1, and L=3 in the example shown in FIG. 1. The correspondence between the filter coefficients and the multipliers is such that w(i, 0) corresponds to the multiplier 14, w(i, 1) corresponds to the multiplier 15, and w(i, 2) corresponds to the multiplier 16. Phase information A(m) instructed by the coefficient readout unit 6 has values of 0 to Q−1. In the memory 5, the set of w(A(m), 0) to w(A(m), 3) of the A(m)th filter coefficients indicated by the phase information A(m) is read out by the coefficient readout unit 6 as the filter coefficients.

The coefficient readout unit 6 uses the phase signal A(m) output from the phase-accuracy conversion unit 4 as a readout address to read out the filter coefficients from the memory 5 according to the phase signal A(m), and outputs the filter coefficients to the digital filter unit 1 so as to switch the filter coefficients to be used by the multipliers 14, 15, and 16.

The digital filter unit 1 performs the product-sum operation of the input signal and the filter coefficients output from the coefficient readout unit 6 and generates the interpolated signal D(m) from the input signal to output the interpolated signal D(m).

An operation on the side of the digital filter unit 2 to which the phase signal B(m) is output is explained next. FIG. 5 is a diagram showing a shift register provided in the phase-error calculation unit 7. The phase signal B(m) from the phase-accuracy conversion unit 4 is input to the phase-error calculation unit 7, and the phase signals B(m−1) to B(m−K) up to K previous steps are stored in the shift register in each sampling cycle of the output signal. In this example, K is the same value as the number of the multipliers provided in the digital filter unit 2 for performing a convolution operation. The phase-error calculation unit 7 converts these stored phase signals to phase error signals B'(m−1) to B'(m−K) according to the following equation (6). In this example, N is the number of oversamplings calculated by "(the output sampling frequency)/(the input sampling frequency)". The number of oversamplings always takes a constant value if the output sampling frequency and the input sampling frequency are fixed.

$$B'(m)=B(m)\times N \quad (6)$$

The phase-error calculation unit 7 outputs phase error signals corresponding to the number of delay time steps of the output data from the digital filter unit 1 stored in the shift register provided in the digital filter unit 2. For example, in the phase-error calculation unit 7, because the digital filter unit 2 shown in FIG. 1 fetches output data D(m−1), D(m−2), and D(m−3) from the digital filter unit 1 therein, the phase-error calculation unit 7 outputs the phase error signals B'(m−1), B'(m−2), and B'(m−3).

The memory 8 stores therein P sets of filter coefficients in total in order of 0/(P×N), N/(P×N), 2N/(P×N), . . . , and (P×N−N)/(P×N) with a N/(P×N) phase interval of the cycle of the input sampling frequency. One set of filter coefficients is constituted as many filter coefficients as the multipliers included in the digital filter unit 2, and a filter coefficient corresponding to each multiplier is defined.

FIG. 6 is a diagram showing the internal configuration of the memory 8. The i-th filter coefficients are filter coefficients for an (i×N)/(P×N) phase and include u(i, 0) to u(i, K−1). K denotes the number of the multipliers included in the digital filter unit 2, and K=3 in the example shown in FIG. 1.

The correspondence between the filter coefficients and the multipliers is such that u(i, 0) corresponds to the multiplier 24, u(i, 1) corresponds to the multiplier 25, and u(i, 2) corresponds to the multiplier 26. The pieces of phase error information B'(m−1) to B'(m−3) instructed by the coefficient readout unit 9 have values of P×N(P=0 to P−1). In the memory 8, u(B'(m−1), 0) of the B'(m−1)th filter coefficient, u(B'(m−2), 1) of the B'(m−2)th filter coefficient, and u(B'(m−3), 2) of the B'(m−3)th filter coefficient indicated by the phase error information B'(m−1) to B'(m−3) are read out by the coefficient readout unit 9 as the filter coefficients.

In the memory 8, different from the memory 5, a plurality of pieces of phase error information are input thereto, and the value of the phase error information and one filter coefficient u(x, y) corresponding to one multiplier are read out according to the number of delay steps in the phase error information, with respect to each of the pieces of phase error information.

The coefficient readout unit 9 reads out the filter coefficients from the memory 8 according to the phase error signals B'(m−1) to B'(m−3) by using the phase signals B'(m−1) to B'(m−K) output from the phase-error calculation unit 7 as the readout addresses to take out the filter coefficients u(B'(m−1), 0) to u(B'(m−3), 2) (T(m−1) to T(m−3) in FIG. 1). Generally, to maintain a constant filter gain regardless of the filter number i, it is designed such that the sum of the filter coefficients u(i, 0)+u(i, 1)+u(i, 2)=Z also becomes constant. In this example, Z is an arbitrary fixed real number. However, when the filter number of the filter coefficient to be taken out for each multiplier is different as described above, the sum u(B'(m−1), 0)+u(B'(m−2), 1)+u(B'(m−3), 2) of the taken out filter coefficients does not become constant and varies according to the combination of B'(m−1) to B'(m−3).

Therefore, the gain normalization unit 10 obtains a normalization factor by using the following equations (7) to (9), and normalizes the taken out filter coefficients, thereby maintaining the constant filter gain regardless of the combination of B'(m−1) to B'(m−3).

$$w0=u(B'(m-1), 0)\times Z/(u(B'(m-1), 0)+u(B'(m-2), 1)+u(B'(m-3), 2)) \quad (7)$$

$$w1=u(B'(m-2), 1)\times Z/(u(B'(m-1), 0)+u(B'(m-2), 1)+u(B'(m-3), 2)) \quad (8)$$

$$w2=u(B'(m-3), 2)\times Z/(u(B'(m-1), 0)+u(B'(m-2), 1)+u(B'(m-3), 2)) \quad (9)$$

The gain normalization unit 10 converts the filter coefficients (T(m−1), T(m−2), and T(m−3)) output from the coefficient readout unit 9 to normalized filter coefficients w0, w1, and w2 (T'(m−1), T'(m−2), and T'(m−3) in FIG. 1) to output the normalized filter coefficients to the digital filter unit 2, and switches the filter coefficients to be used by the multipliers 24, 25, and 26, respectively.

The digital filter unit 2 performs the product-sum operation of the interpolated signal D(m) output from the digital filter unit 1 as the input signal and the filter coefficients output from the gain normalization unit 10 to correct an error included in the interpolated signal D(m), and generates and outputs the interpolated signal D'(m). At this point, signals multiplied by the multipliers 24, 25, and 26 are, respectively, interpolated signals D(m−1), D(m−2), and D(m−3).

As explained above, in the present embodiment, the signal generating device corrects a phase error included in an interpolated signal being an output of the digital filter unit 1 by setting the filter coefficients to the multipliers by the digital filter unit 2 connected to the subsequent stage, according to a phase error different for each output sampling timing. Accordingly, the memory capacity of the filter coefficients in the memory can be reduced as compared with conventional cases of obtaining a similar interpolation accuracy.

INDUSTRIAL APPLICABILITY

As described above, the signal generating device according to the present invention is useful for communication of a digital signal and particularly suitable when a signal is interpolated.

REFERENCE SIGNS LIST

1, 2 digital filter unit, 3 phase calculation unit, 4 phase-accuracy conversion unit, 5, 8 memory, 6, 9 coefficient readout unit, 7 phase-error calculation unit, 10 gain normalization unit, 11, 12, 13, 21, 22, 23 delay unit, 14, 15, 16, 24, 25, 26 multiplier, 17, 18, 27, 28 adder, 31 cumulative adder.

The invention claimed is:

1. A signal generating device comprising:
 a first digital filter that outputs a first interpolated signal by interpolating an input signal;
 a second digital filter that outputs a second interpolated signal by interpolating the first interpolated signal;
 a phase calculation unit that calculates a phase of a digital signal that changes for each output sampling cycle of the first and second digital filters;
 a phase-accuracy conversion unit that calculates a first phase signal and a second phase signal on a basis of the phase of the digital signal;
 a first memory that stores therein a first filter coefficient of the first digital filter;
 a first coefficient readout unit that reads out the first filter coefficient from the first memory on a basis of the first phase signal and switches the first filter coefficient of the first digital filter;
 a phase-error calculation unit that calculates a phase error signal on a basis of the second phase signal;
 a second memory that stores therein a second filter coefficient of the second digital filter;
 a second coefficient readout unit that reads out the second filter coefficient from the second memory on a basis of the phase error signal; and
 a gain normalization unit that switches the second filter coefficient of the second digital filter on a basis of the second filter coefficient read out from the second memory in the second coefficient readout unit.

2. The signal generating device according to claim 1, wherein
 when a phase resolution of the signal generating device is expressed by a product of a phase resolution of the first digital filter and a phase resolution of the second digital filter,
 the phase-accuracy conversion unit designates, out of bits indicating the phase of the digital signal, high-order bits for number of bits expressing the phase resolution of the first digital filter as the first phase signal and a remaining low-order bit as the second phase signal.

3. The signal generating device according to claim 1, wherein
 a number of multipliers included in the second digital filter is K, and
 the phase-error calculation unit includes a register that is capable of storing therein the second phase signals at up to K previous steps in each output sampling cycle, and calculates phase error signals at one previous step to K previous steps, on a basis of the second phase signals at one previous step to K previous steps stored in the register and number of oversamplings.

4. The signal generating device according to claim 3, wherein the second coefficient readout unit reads out, from the second memory, a filter coefficient of the second digital filter, with respect to a signal output from the first digital filter at one previous step to K previous steps, on a basis of the phase error signals at one previous step to K previous steps.

5. The signal generating device according to claim 3, wherein the second coefficient readout unit reads out a filter coefficient uniquely from the second memory, on a basis of a phase error value of the phase error signal and information indicating which step before the second phase signal is used for calculating the phase error value.

\* \* \* \* \*